(12) United States Patent
Loubet et al.

(10) Patent No.: US 8,796,147 B2
(45) Date of Patent: Aug. 5, 2014

(54) LAYER FORMATION WITH REDUCED CHANNEL LOSS

(75) Inventors: Nicolas Loubet, Guilderland, NY (US); Qing Liu, Guilderland, NY (US); Prasanna Khare, Schenectady, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 12/971,054

(22) Filed: Dec. 17, 2010

(65) Prior Publication Data
US 2012/0156847 A1 Jun. 21, 2012

(51) Int. Cl.
*H01L 21/311* (2006.01)
*H01L 21/302* (2006.01)

(52) U.S. Cl.
USPC ........... 438/694; 438/696; 438/704; 438/723; 438/724; 438/744

(58) Field of Classification Search
USPC .......... 438/694, 696, 704, 723, 724, 743, 744
See application file for complete search history.

(56) References Cited

U.S. PATENT DOCUMENTS

| | | | |
|---|---|---|---|
| 6,777,298 B2 * | 8/2004 | Roy et al. ....................... | 438/301 |
| 7,759,205 B1 | 7/2010 | Maitra et al. | |
| 2004/0129981 A1 * | 7/2004 | Kim et al. ..................... | 257/368 |
| 2005/0095867 A1 * | 5/2005 | Shimada ....................... | 438/720 |
| 2007/0075385 A1 | 4/2007 | Lee et al. | |
| 2008/0237715 A1 | 10/2008 | Hisamatsu | |
| 2009/0032874 A1 | 2/2009 | Loubet et al. | |
| 2009/0159934 A1 * | 6/2009 | Amos et al. ................... | 257/256 |
| 2009/0179256 A1 | 7/2009 | Lin et al. | |
| 2010/0184265 A1 * | 7/2010 | Maitra et al. .................. | 438/303 |

* cited by examiner

*Primary Examiner* — Hsien Ming Lee
(74) *Attorney, Agent, or Firm* — Wolf, Greenfield & Sacks, P.C.

(57) ABSTRACT

Insulating layers can be formed over a semiconductor device region and etched in a manner that substantially reduces or prevents the amount of etching of the underlying channel region. A first insulating layer can be formed over a gate region and a semiconductor device region. A second insulating layer can be formed over the first insulating layer. A third insulating layer can be formed over the second insulating layer. A portion of the third insulating layer can be etched using a first etching process. A portion of the first and second insulating layers beneath the etched portion of the third insulating layer can be etched using at least a second etching process different from the first etching process.

13 Claims, 13 Drawing Sheets

LAYER FORMATION WITH REDUCED CHANNEL LOSS

BACKGROUND OF THE INVENTION

1. Field of Invention

The techniques described herein relate generally to the formation and etching of regions on a semiconductor substrate. In particular, some embodiments relate to a layer deposition and etching technique capable of reducing the amount of channel loss that occurs during these processes.

2. Discussion of the Related Art

Field effect transistors can be formed in a silicon device layer having a channel region that extends laterally along the silicon device layer. It has been found that forming thinner channels can enable better control of transistor operation. One way of forming a thinner channel region is by polishing the wafer to reduce the thickness of the silicon device layer to about 6-8 nm, for example. It would be desirable to precisely control the thickness of the device layer to reduce the variation in transistor properties.

SUMMARY

Some embodiments relate to a method, comprising: forming a first insulating layer over a gate region and a semiconductor device region; forming a second insulating layer over the first insulating layer; forming a third insulating layer over the second insulating layer; etching a portion of the third insulating layer using a first etching process; and etching a portion of the first and second insulating layers beneath the etched portion of the third insulating layer using at least a second etching process different from the first etching process.

Some embodiments relate to a method, comprising: forming a first layer over a semiconductor device region, the first layer comprising a first material; forming a second layer over the first layer, the second layer comprising a second material; etching a portion of the second layer using a first etching process; and etching a portion of the first layer using a second etching process that reaches the semiconductor device region and substantially does not etch the semiconductor device region.

The foregoing is a non-limiting summary of some embodiments of the invention.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention.

DETAILED DESCRIPTION

Various layers can be deposited and etched to form the gate and spacer regions of a transistor over the device layer or channel layer of the transistor. In prior techniques, these etching processes can result in unintended etching of the channel region of the transistor. However, when forming transistors with channel regions that are very thin, such as on the order of 6-8 nm, unintended etching of the channel region can cause a variation in channel thickness and an undesired variation in the transistor properties such as the threshold voltage $V_{TH}$. It would be desirable to reduce unintended etching of the channel region to reduce variation in the properties of the transistors that are produced.

In some embodiments, insulating layers can be formed over the channel/device region and etched in a manner that substantially reduces or prevents the amount of etching of the underlying channel region. Exemplary techniques are described below.

Figure 1:
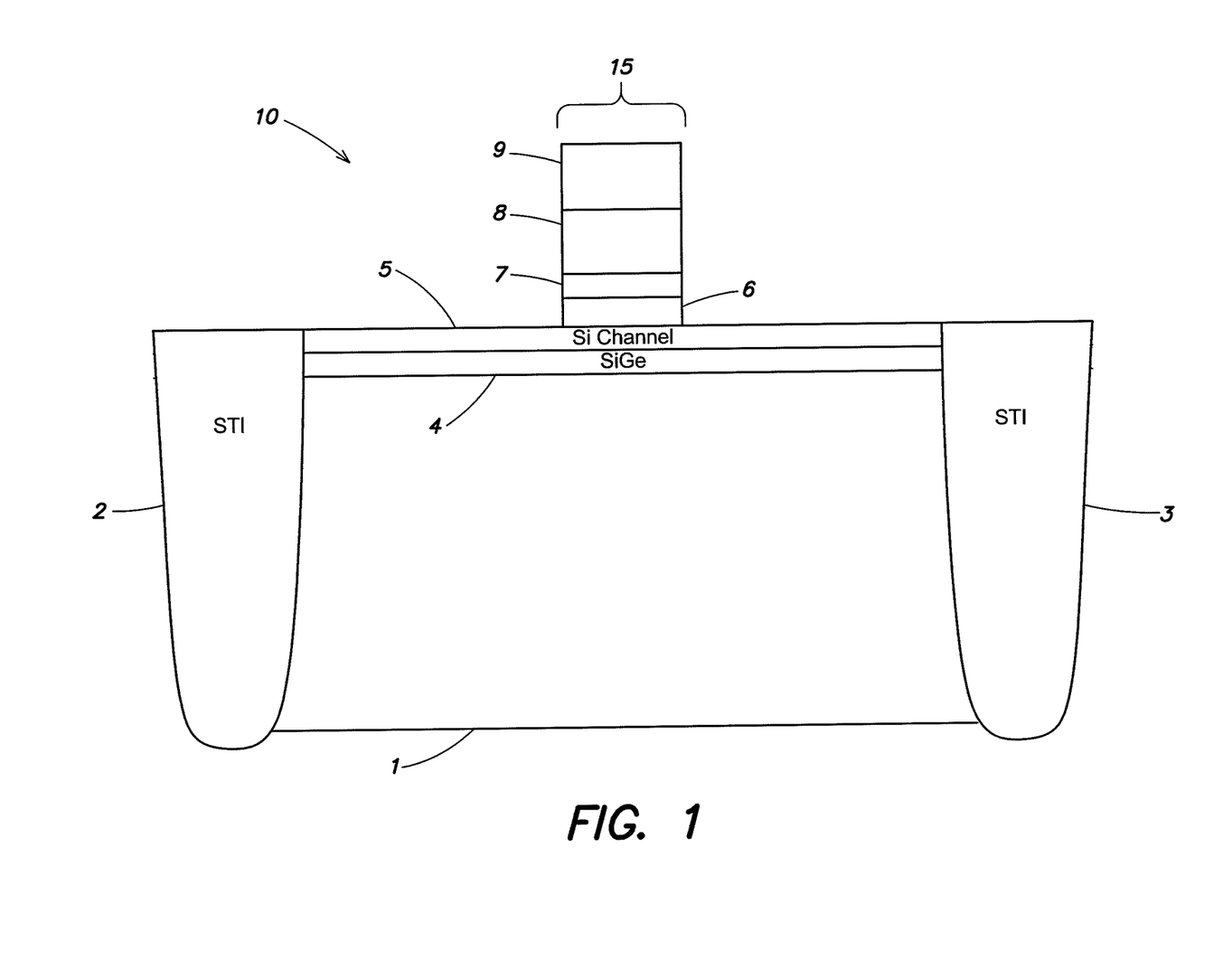
FIG. 1 shows a cross-section of a semiconductor structure.

FIG. 1 shows a cross-section of a semiconductor structure 10 that may include a semiconductor region 1, shallow trench isolation regions 2, 3, a sacrificial semiconductor region 4 above the semiconductor region 1, a semiconductor device region 5, and a gate region 15 that may include a gate dielectric layer 6, a metal layer 7, an amorphous silicon layer 8, and an insulating layer 9. However, the techniques described herein are not limited to the particular arrangement of regions and materials shown in FIG. 1.

Semiconductor region 1 may be a region of bulk semiconductor, such as single crystalline silicon or another semiconductor material. Shallow trench isolation regions 2 and 3 may be formed of silicon oxide, for example, or any other suitable insulating material. Sacrificial semiconductor region 4 may be formed of SiGe or any other suitable material. Semiconductor device region 5 may be formed of silicon or any other suitable semiconductor material for forming the channel region of a transistor. Semiconductor device region 5 may be thin in some embodiments, such as on the order of about 6 to 8 nanometers along the vertical dimension of FIG. 1. However, semiconductor device region 5 may have any suitable thickness, as the techniques described herein are not limited in this respect. Dielectric layer 6 may be formed of a high k dielectric material, or any other suitable dielectric material. Metal layer 7 may be formed of any suitable metal gate material. Semiconductor layer 8 may be formed of amorphous silicon, or any other suitable material. Insulating layer 9 may be formed of silicon nitride, or any other suitable material. Although FIG. 1 illustrates one example of a semiconductor structure, it should be appreciated that the techniques described herein may be used with any suitable semiconductor structure having a semiconductor device layer, so that etching of the device layer can be reduced or prevented.

Figure 2:
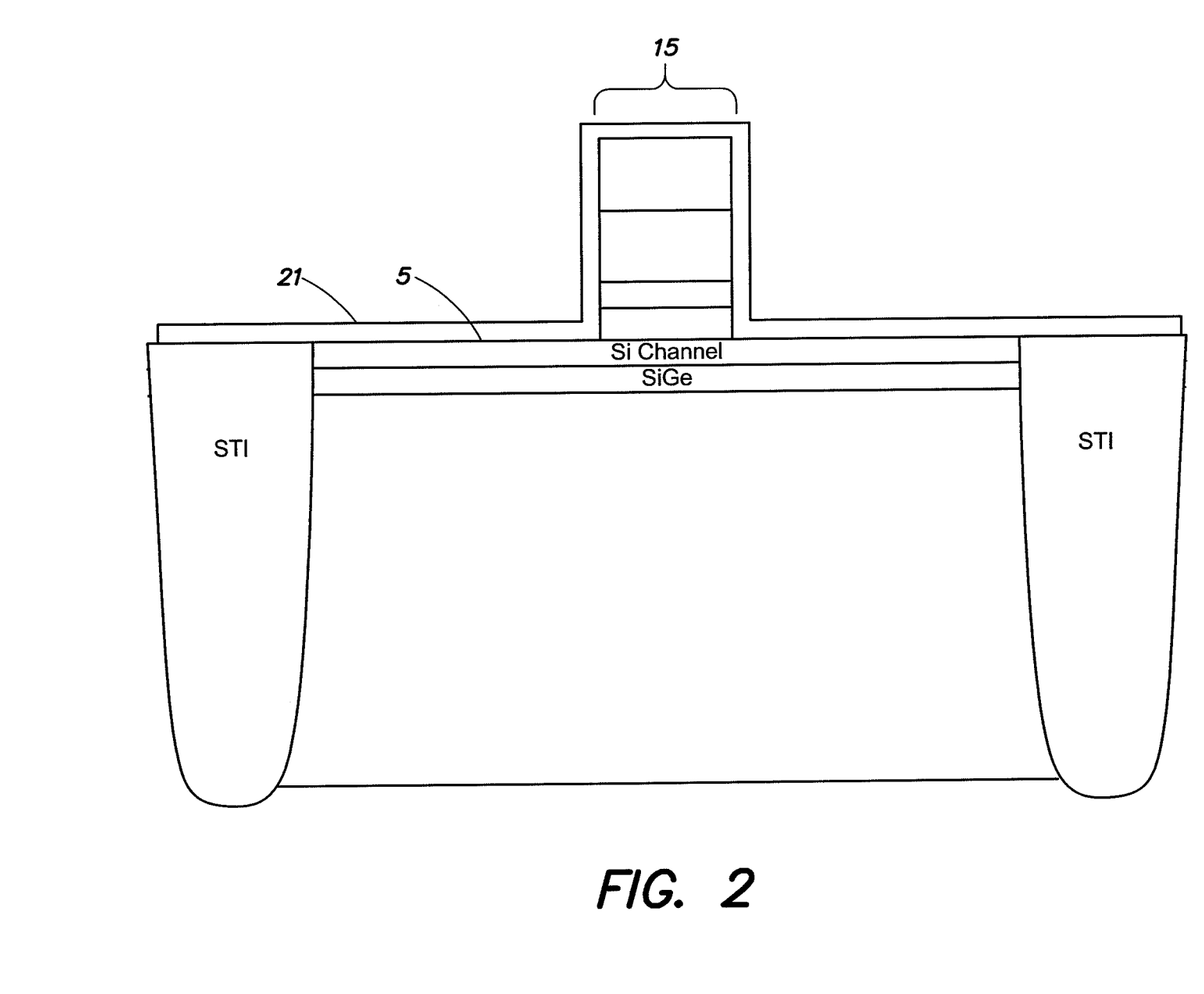
FIG. 2 shows the deposition of a first insulating layer on the semiconductor structure, according to some embodiments.
Figure 3:
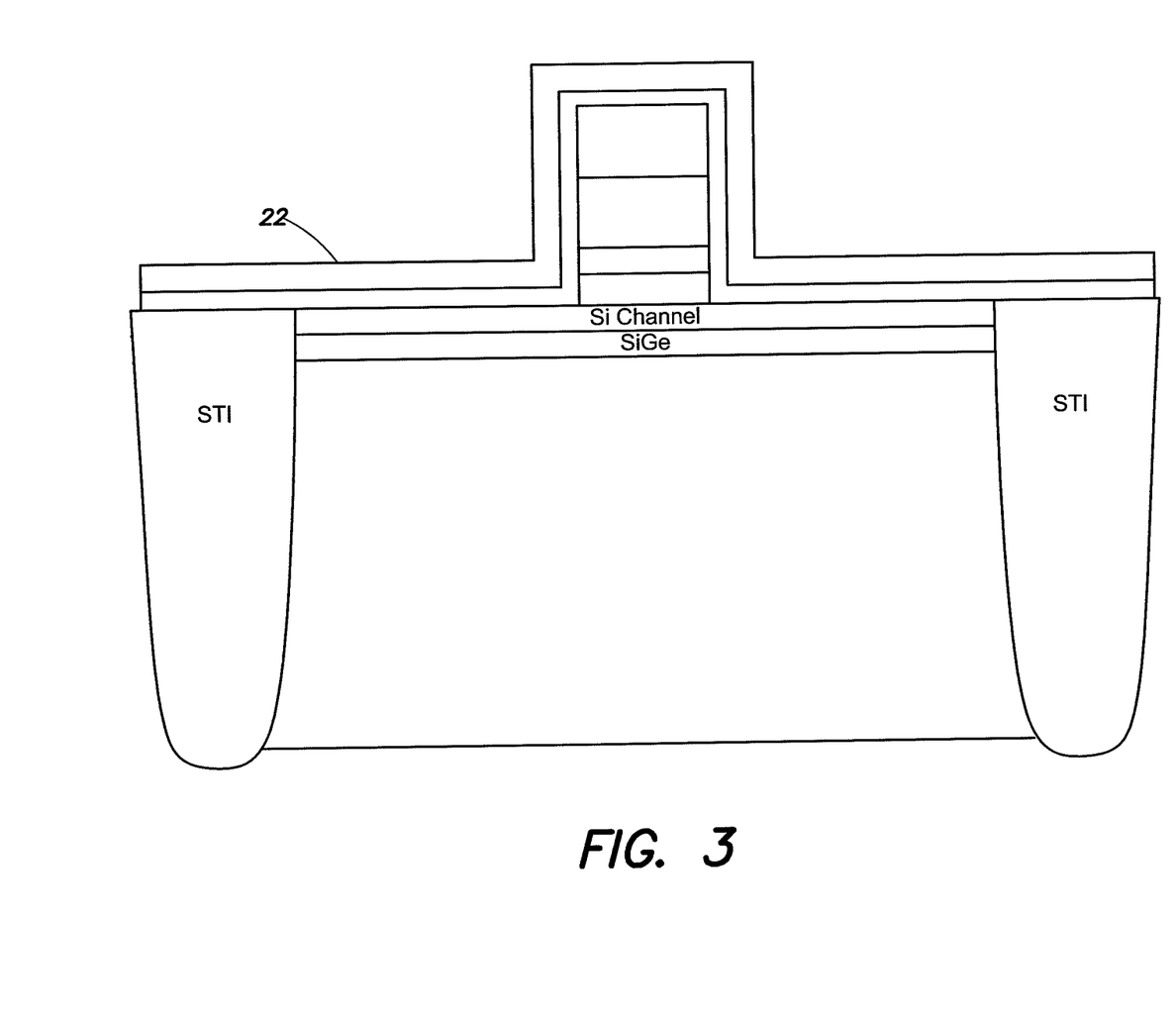
FIG. 3 shows the deposition of a second insulating layer on the first insulating layer, according to some embodiments.
Figure 4:
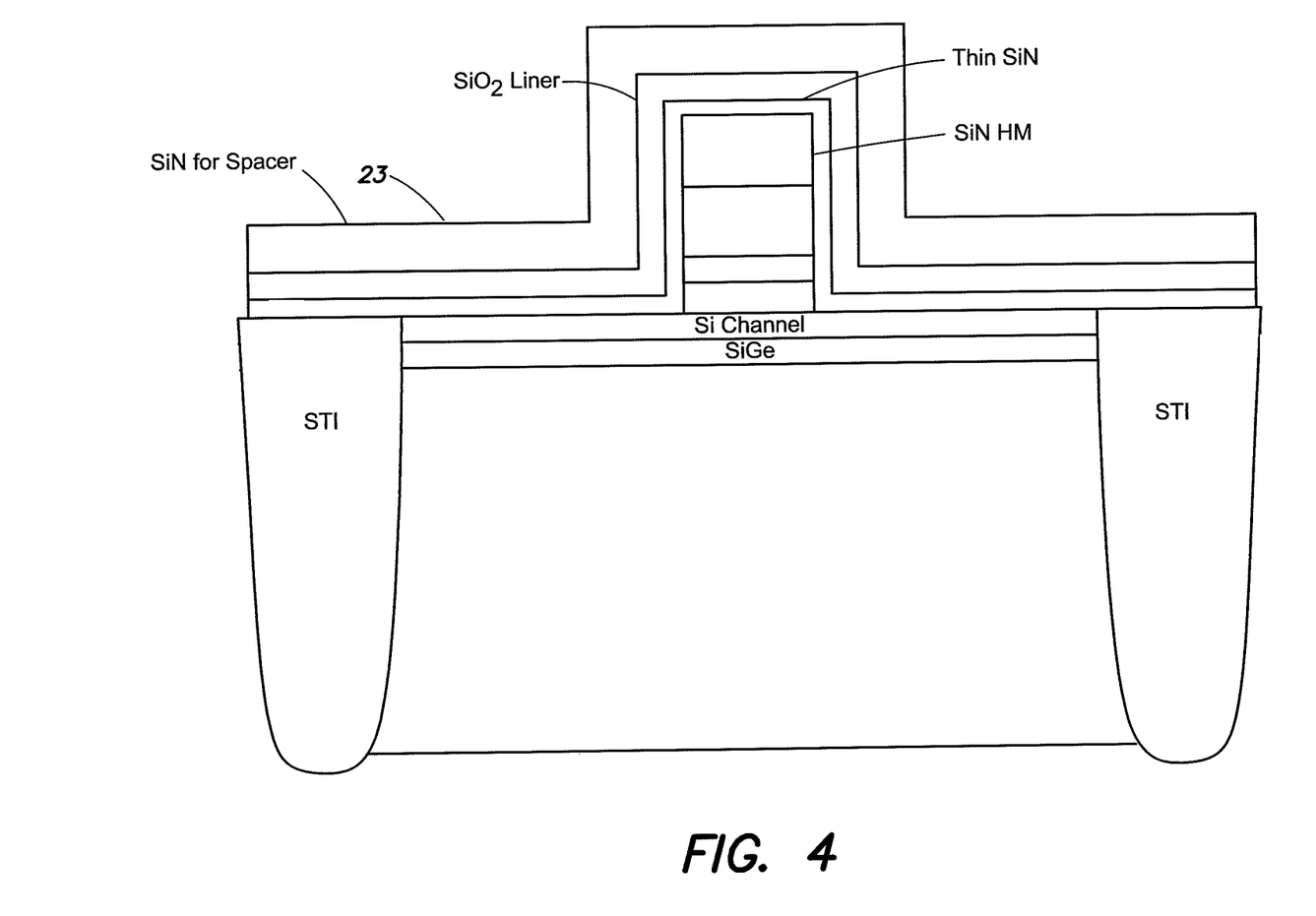
FIG. 4 shows the deposition of a third insulating layer on the second insulating layer, according to some embodiments.

As shown in FIGS. 2-4, insulating layers can be deposited over and adjacent to the gate region 15, and may form spacer regions for the transistor.

FIG. 2 shows that a thin insulating layer 21 can be deposited over the semiconductor device region 5 and the gate region 15. In some embodiments, insulating layer 21 can be formed of silicon nitride. However, the techniques described herein are not limited as to the material used to form insulating layer 21. For example, insulating layer 21 can be formed of a different material that is selectively etchable with respect to semiconductor device region 5.

FIG. 3 shows that an insulating layer 22 can then be deposited over insulating layer 21. In some embodiments, insulating layer 22 may be a thin silicon oxide layer. However, the techniques described herein are not limited as to the material used to form insulating layer 22. For example, insulating layer 22 can be formed of a different material that is selectively etchable with respect to insulating layer 21.

FIG. 4 shows that an insulating layer 23 can then be deposited on insulating layer 22. In some embodiments, insulating layer 23 may be formed of silicon nitride. However, the techniques described herein are not limited as to the material used to form insulating layer 23. For example, insulating layer 23 can be formed of a different material that is selectively etchable with respect to insulating layer 22.

Figure 5:
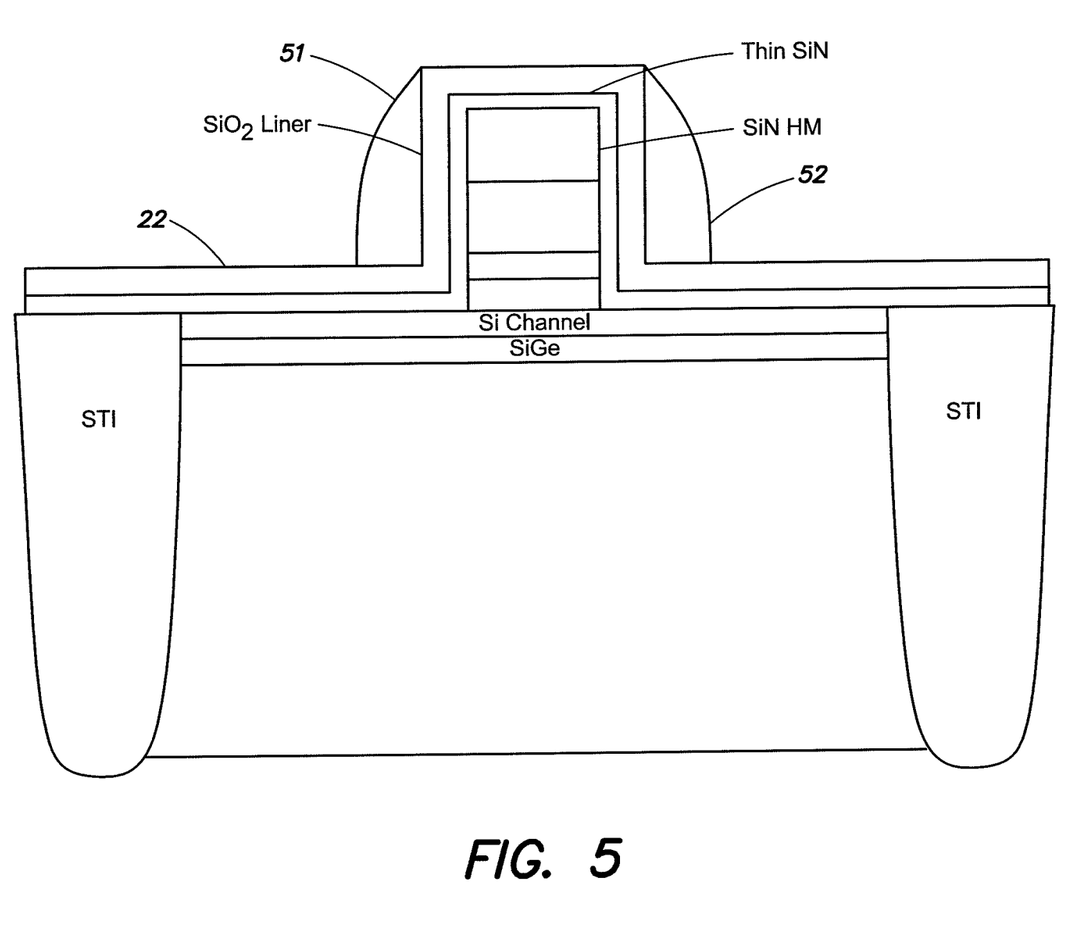
FIG. 5 shows the etching of the third insulating layer to form spacers on the sides of the gate region, according to some embodiments.

As shown in FIG. 5, insulating layer 23 may be etched to form spacers 51, 52 on the sides of the gate region 15. In some embodiments, insulating layer 23 can be etched using a dry etching technique such as a plasma etching technique known as reactive ion etching. Advantageously, insulating layer 22 may act as an etch stop during the process of etching insulating layer 23. In some embodiments, insulating layer 22 is formed of a different material from insulating layer 23 that is not substantially etched in the process used to etch insulating layer 23. Thus, insulating layer 22 can protect the semiconductor device region 5 during the dry etching process used to remove a portion of insulating layer 23.

Figure 6:
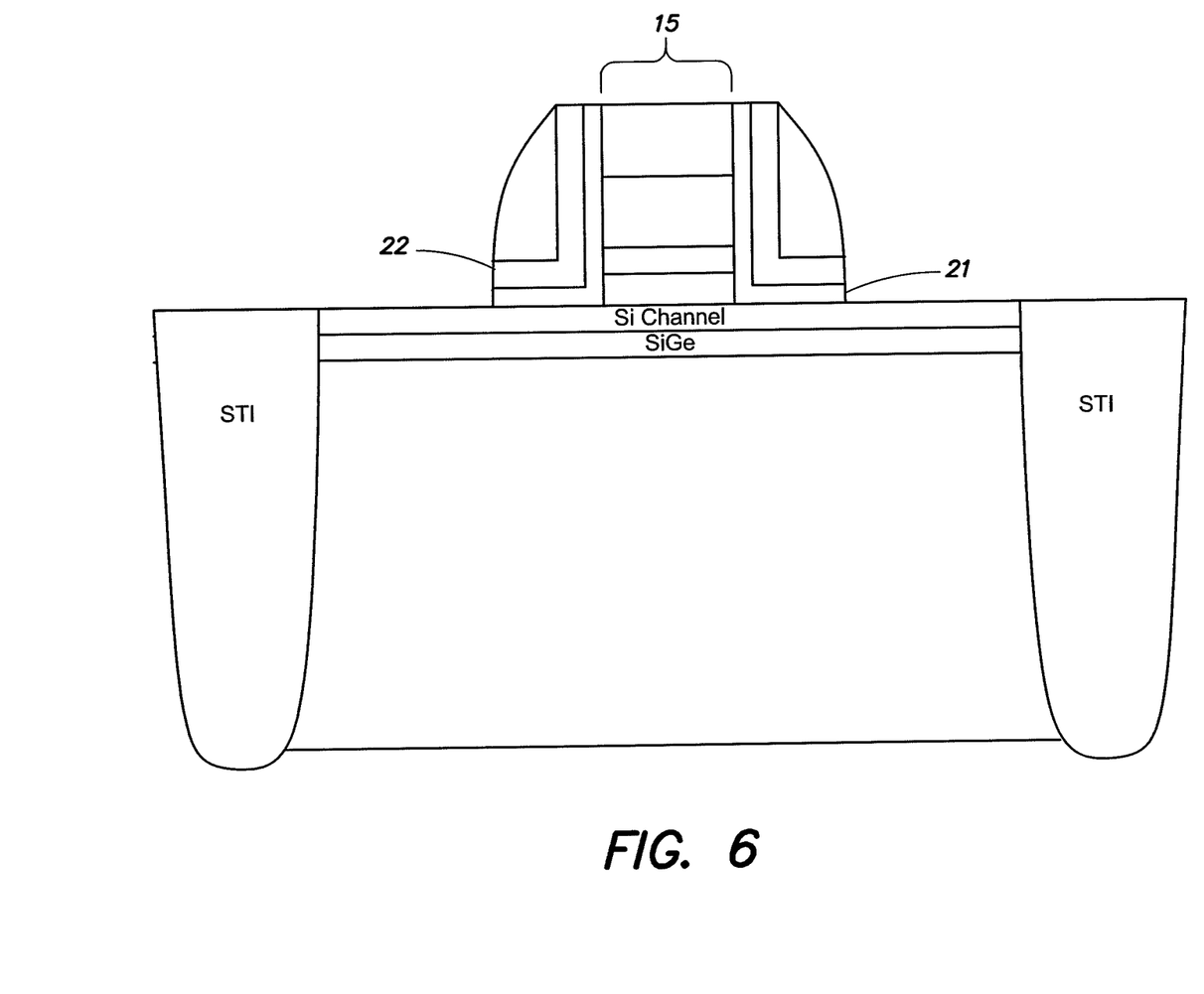
FIG. 6 shows the removal of portions of the first and second insulating layers, according to some embodiments.

As shown in FIG. 6, portions of the insulating layers 21 and 22 on the sides of the gate region may then be removed. In some embodiments, an etching process is used to remove these layers that does not substantially etch the semiconductor device region 5. For example, in some embodiments in which the semiconductor device region is formed of silicon, a hydrofluoric acid (HF) wet etching process may be used that does not substantially remove the semiconductor material on the surface of semiconductor device region 5. However, any suitable etching process may be used to remove portions of insulating layers 21 and 22 that does not substantially etch semiconductor device region 5.

Figure 7:
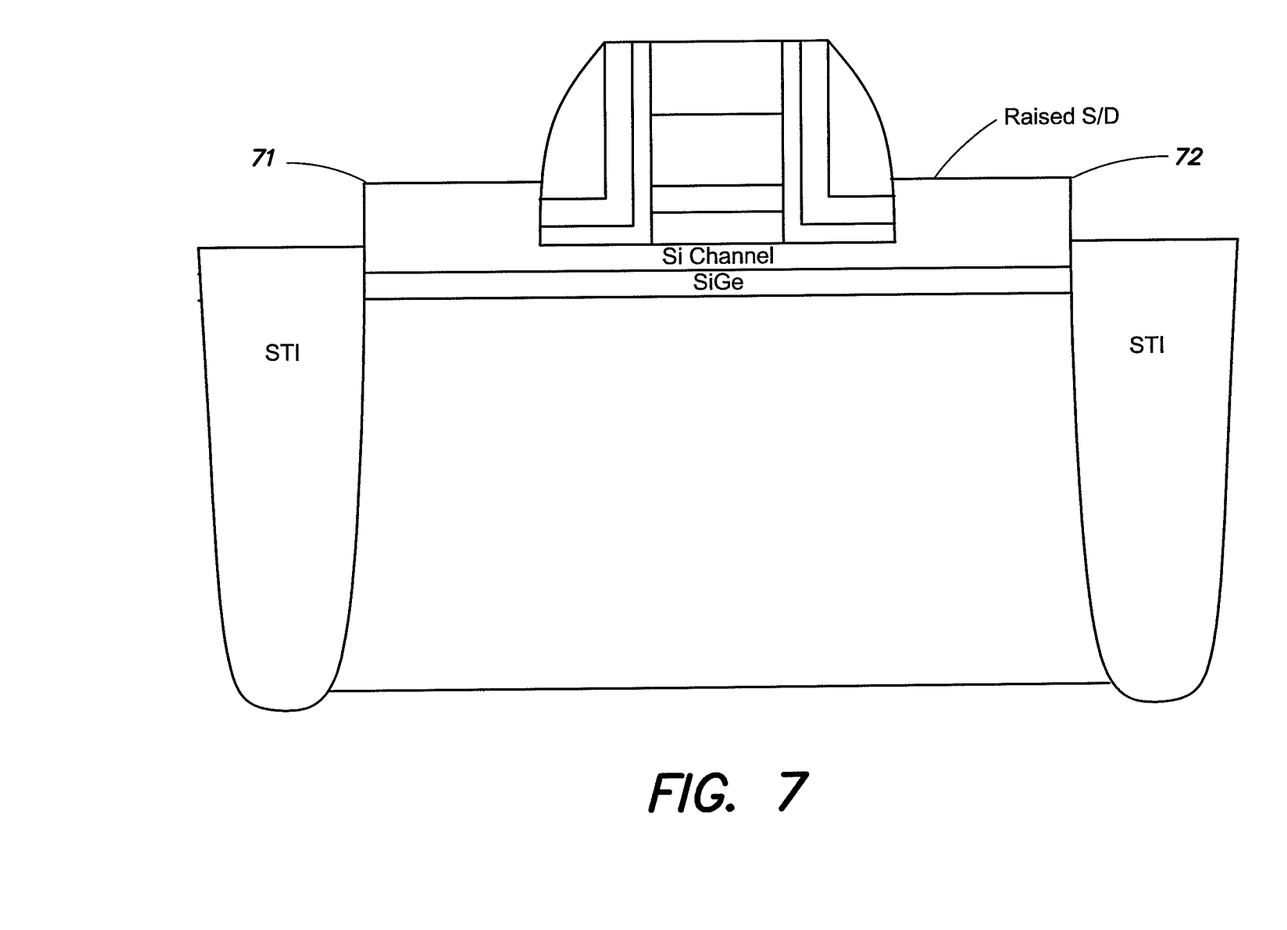
FIG. 7 shows the formation of raised source and drain regions.
Figure 8:
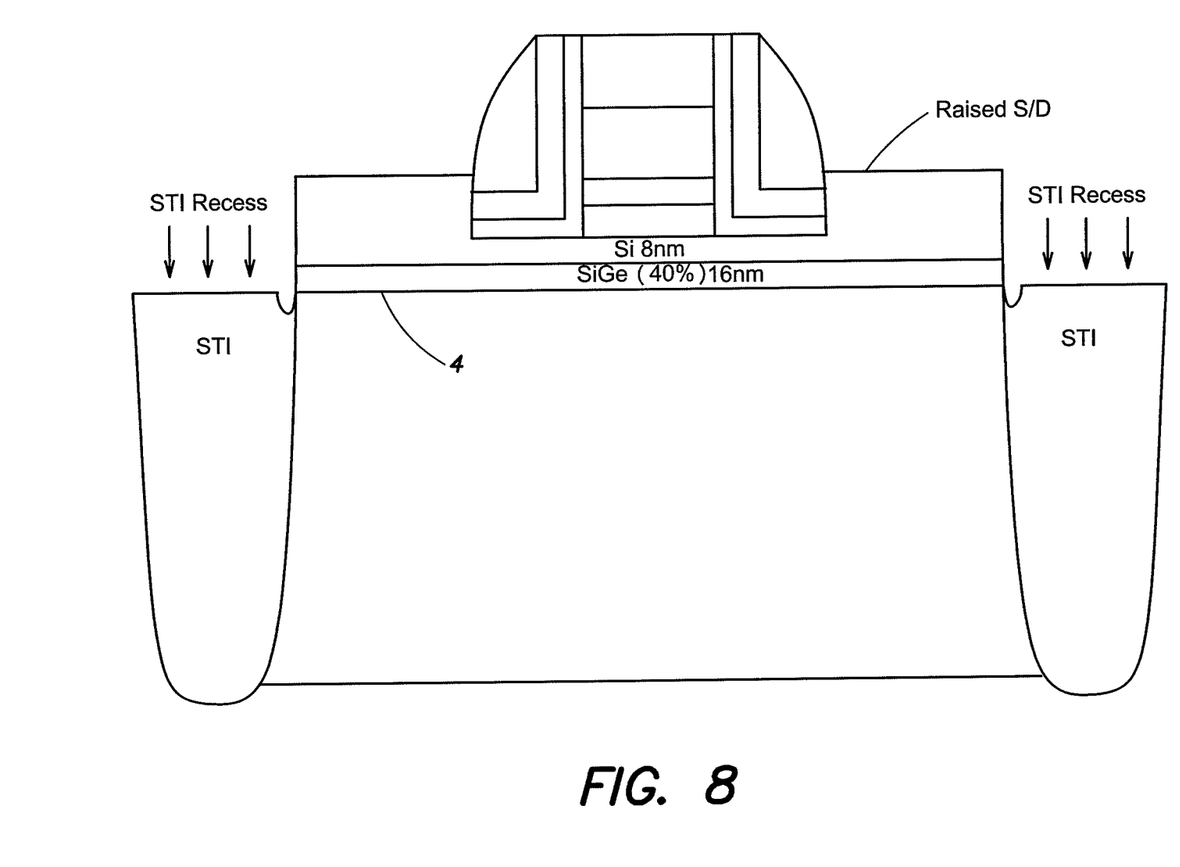
FIG. 8 shows the formation of a recess in the STI regions.
Figure 9:
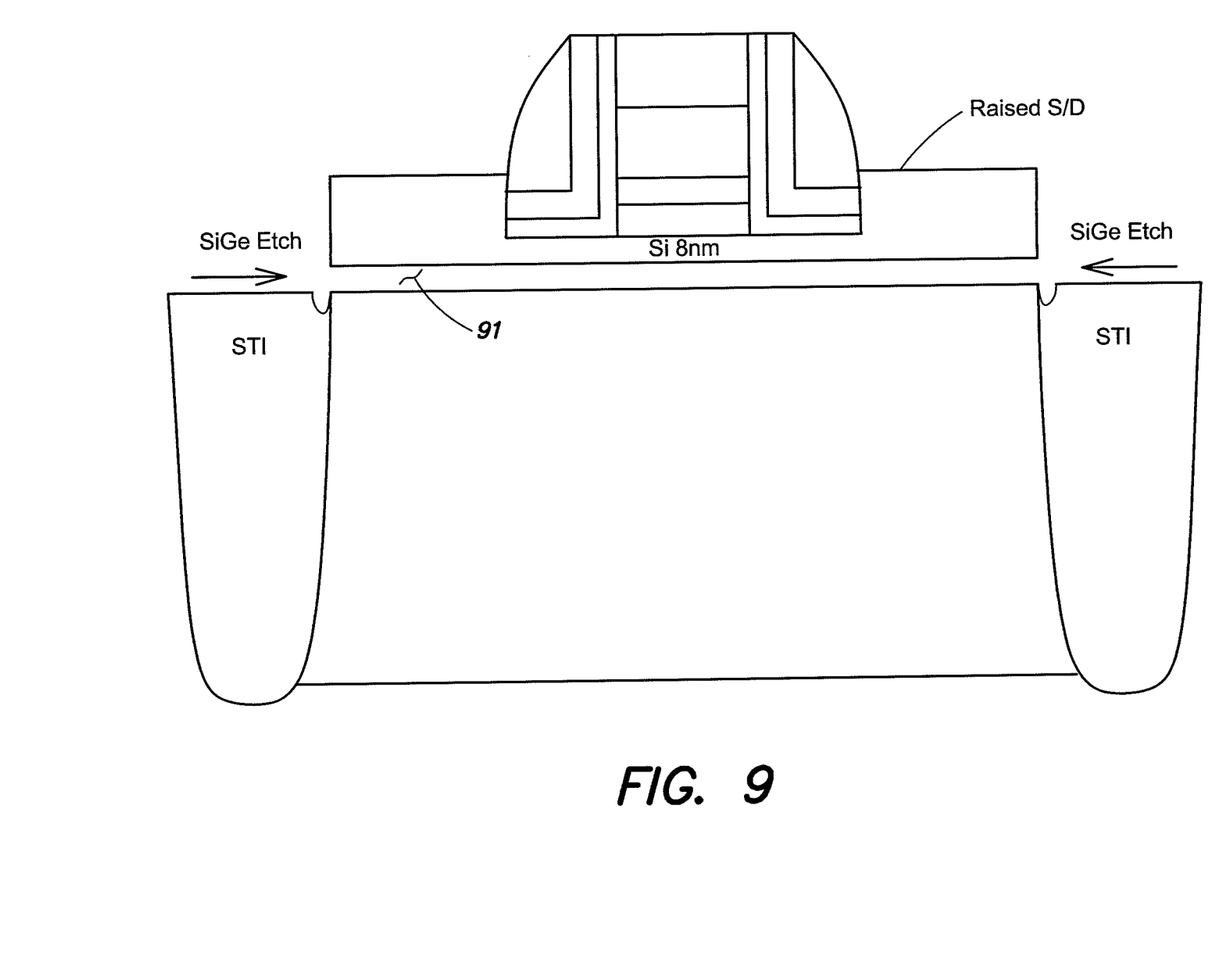
FIG. 9 shows the removal of sacrificial semiconductor layer by etching, thereby forming a cavity beneath the semiconductor device region.

As shown in FIG. 7, raised source and drain regions 71, 72 may be formed on either side of the gate region 15 by any suitable process such as epitaxial deposition, for example. As shown in FIG. 8, a recess may then be formed in the STI regions 2 and 3 to expose the sides of sacrificial semiconductor region 4. Any suitable etching process may be used for removing portions of the STI regions 2 and 3. As shown in FIG. 9, sacrificial semiconductor layer 4 may then be removed by etching, thereby forming a cavity 91 beneath the semiconductor device region 5.

Figure 10:
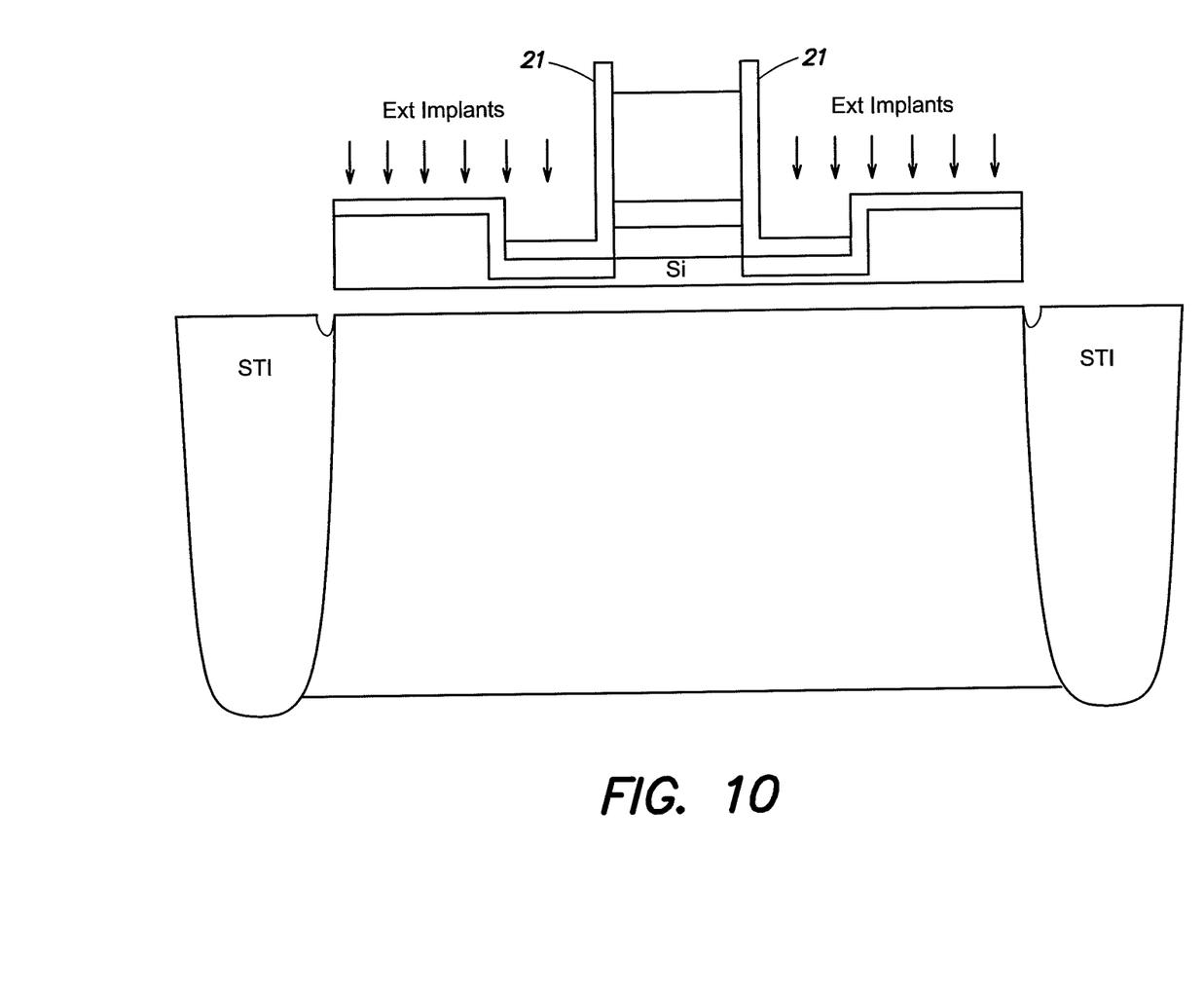
FIG. 10 shows that ion implantation may be performed through the first insulating layer to dope the semiconductor device region on either side of the gate region.

The remaining portions of insulating layers 22 and 23 may be removed by etching. As shown in FIG. 10, one or more portions of the insulating layer 21 may remain above portions of the device layer adjacent to the channel region of the transistor on either side of the gate region 15. As shown in FIG. 10, ion implantation may be performed through the insulating layer 21 to dope the semiconductor device region 5 on either side of the gate region 15. Performing ion implantation through the insulating region 21 can limit the amount of damage that may be caused to semiconductor device layer 5 the during the ion implantation process.

Figure 11:
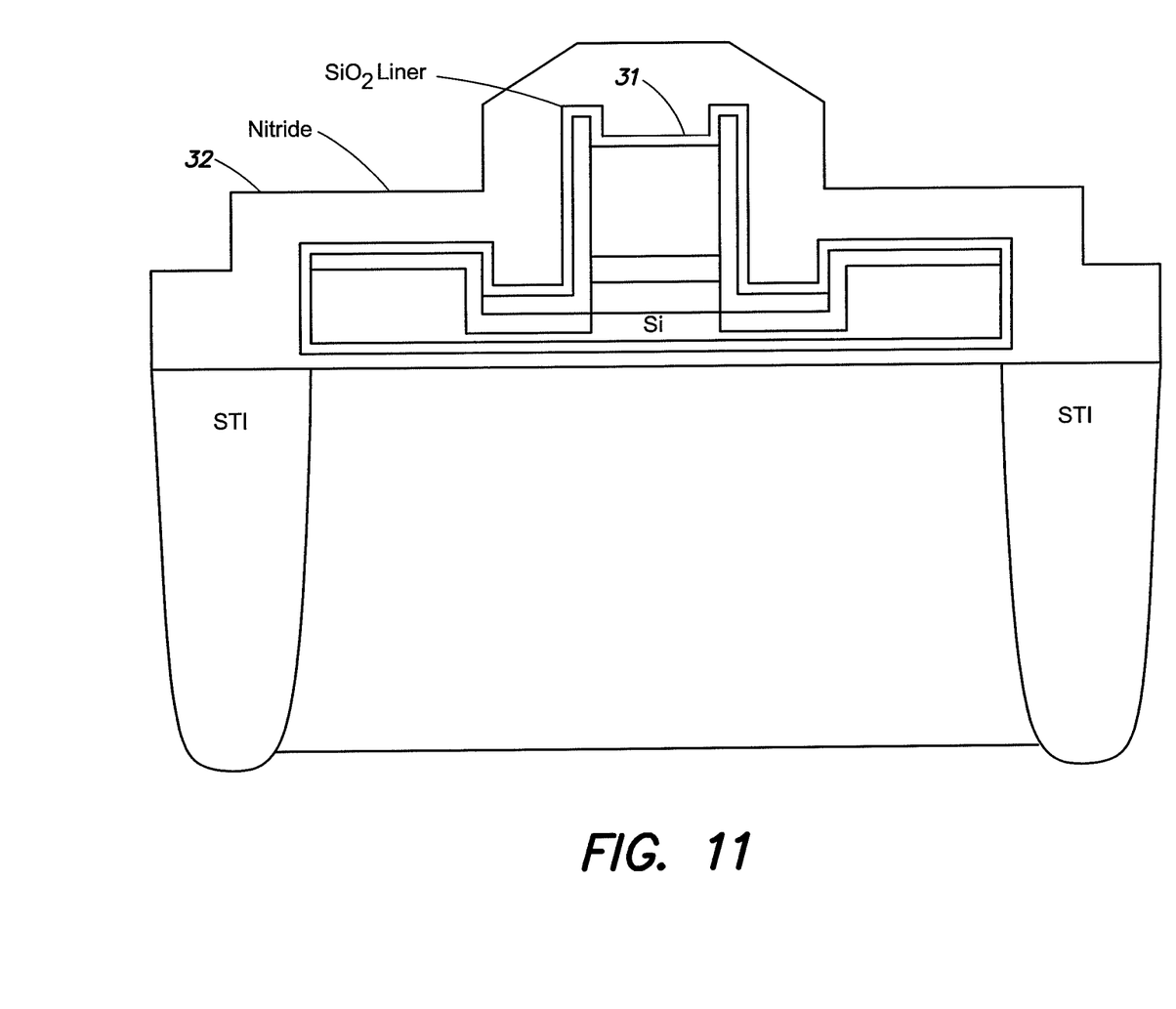
FIG. 11 shows forming additional insulating regions.
Figure 12:
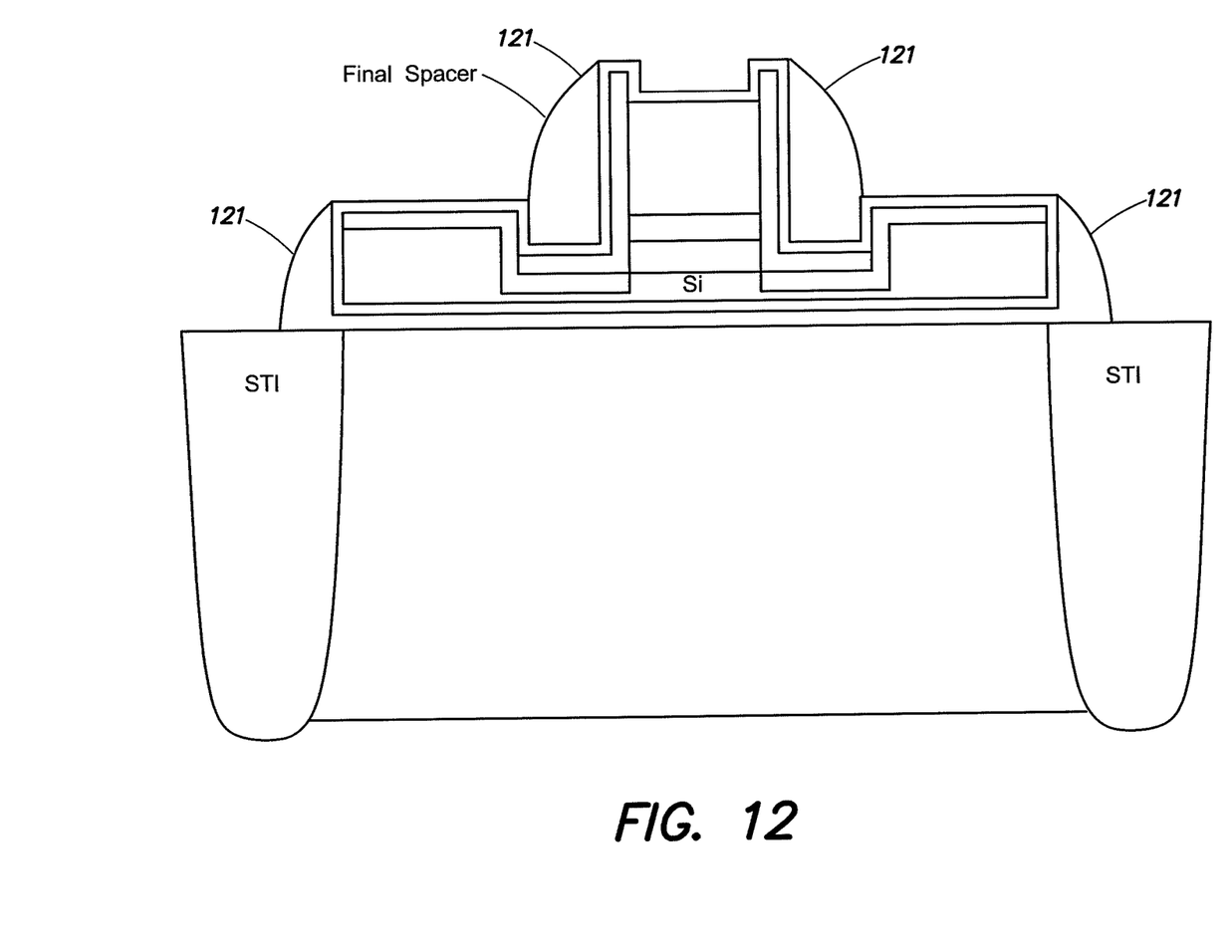
FIG. 12 shows the etching of an additional insulating region to form final spacer regions.
Figure 13:
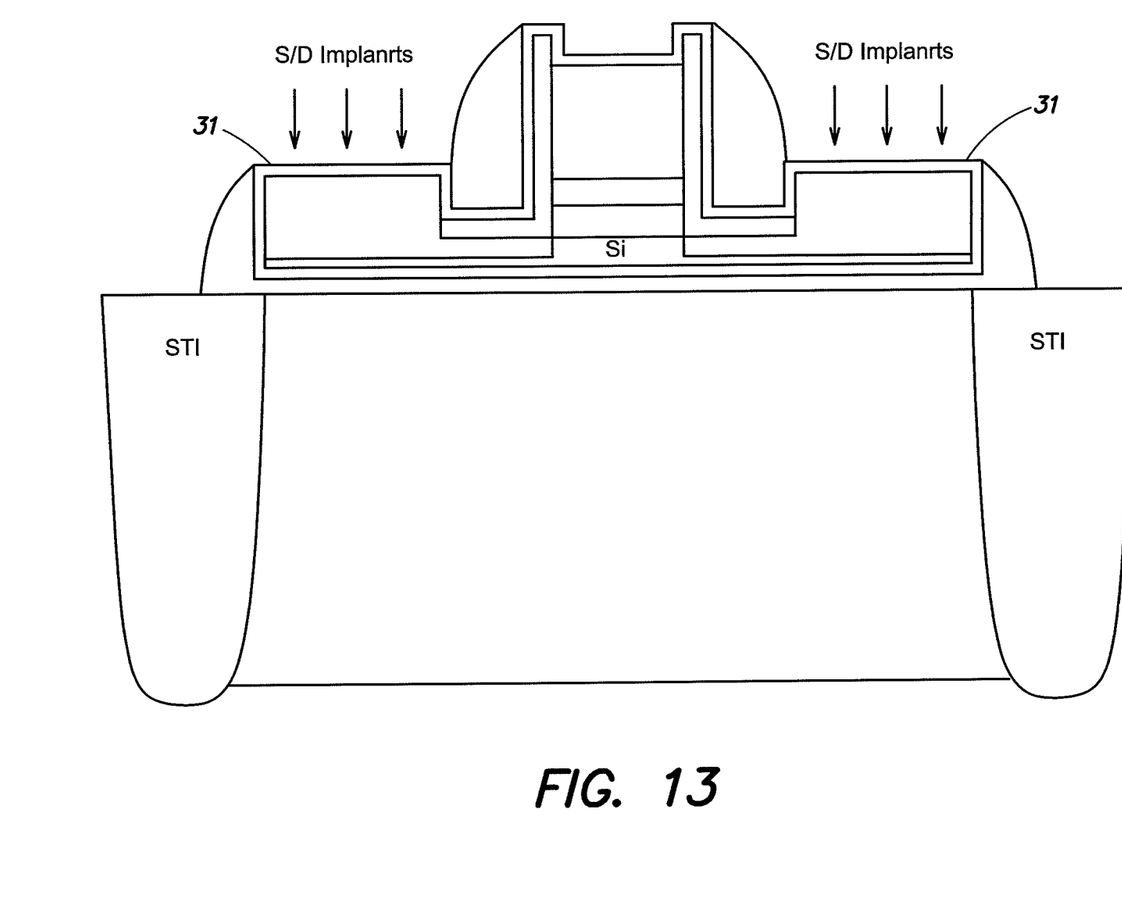
FIG. 13 shows the implantation of dopants for the source and drain regions.

As shown in FIG. 11, an insulating region 31 may be formed on the semiconductor structure above the gate region 15 and the semiconductor device region 5. Insulating layer 31 may be formed of any suitable insulating material, such as silicon oxide. Then, an insulating layer 32 may be formed over the semiconductor structure 10. In some embodiments, the insulating layer 32 may fill the cavity 91 underneath the semiconductor device region 5, which can insulate the semiconductor device layer 5 from semiconductor region 1. Insulating layer 32 may be formed of silicon nitride or any other suitable material. As shown in FIG. 12, the insulating layer 32 may be etched to form final spacer regions 121 adjacent to the gate region 15 and the source and drain regions of the transistor. As shown in FIG. 13, dopants for the source and drain regions may then be implanted through the insulating layer 31.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method, comprising:
    forming a first insulating layer over a gate region and a semiconductor device region;
    forming a second insulating layer over the first insulating layer;
    forming a third insulating layer over the second insulating layer;
    etching a portion of the third insulating layer using a first etching process, wherein the second insulating layer protects the semiconductor device region during the first etching process;
    etching a portion of the first insulating layer beneath the etched portion of the third insulating layer using at least a second etching process, wherein the second etching process comprises a wet etching process; and
    after etching the portion of the first insulating layer, removing a remaining portion of the second insulating layer and a remaining portion of the third insulating layer such that one or more portions of the first insulating layer remains.

2. The method of claim 1, wherein the second insulating layer comprises a different insulating material than the first and third insulating layers.

3. The method of claim 2, wherein forming the first layer comprises forming a first layer comprising silicon nitride.

4. The method of claim 2, wherein forming the second layer comprises forming a second layer comprising silicon oxide.

5. The method of claim 2, wherein forming the third layer comprises forming a third layer comprising silicon nitride.

6. The method of claim 1, wherein the etching of the portion of the first insulating layer substantially does not etch the semiconductor device region.

7. The method of claim 1, further comprising doping the semiconductor device region through at least a portion of the first insulating layer.

8. The method of claim 1, wherein,
   forming the first layer comprises forming a first layer comprising silicon nitride,
   forming the second layer comprises forming a second layer comprising silicon oxide, and
   forming the third layer comprises forming a third layer comprising silicon nitride.

9. The method of claim 8, wherein the etching of the portion of the third insulating layer comprises using a dry etching process.

10. The method of claim 9, wherein the dry etching process comprises reactive ion etching.

11. The method of claim 1, further comprising:
    etching a portion of the second insulating layer beneath the etched portion of the third insulating layer using at least the second etching process.

12. The method of claim 1, wherein the second etching process is different from the first etching process.

13. The method of claim 12, wherein the etching of the portion of the third insulating layer comprises using a dry etching process.

* * * * *